United States Patent
Wu et al.

(10) Patent No.: US 9,480,187 B2
(45) Date of Patent: Oct. 25, 2016

(54) COOLING METHOD FOR A 3D IC COMPUTER SYSTEM

(71) Applicants: Banqiu Wu, San Jose, CA (US); Ming Xu, San Jose, CA (US)

(72) Inventors: Banqiu Wu, San Jose, CA (US); Ming Xu, San Jose, CA (US)

(*) Notice: Subject to any disclaimer, the term of this patent is extended or adjusted under 35 U.S.C. 154(b) by 0 days.

(21) Appl. No.: 14/672,191

(22) Filed: Mar. 29, 2015

(65) Prior Publication Data

US 2016/0286689 A1    Sep. 29, 2016

(51) Int. Cl.
    *H05K 7/20* (2006.01)
    *G06F 1/20* (2006.01)

(52) U.S. Cl.
    CPC ............ *H05K 7/2079* (2013.01); *G06F 1/206* (2013.01); *H05K 7/20* (2013.01); *H05K 7/20218* (2013.01); *H05K 7/20763* (2013.01); *G06F 1/20* (2013.01); *H05K 7/20709* (2013.01)

(58) Field of Classification Search
    None
    See application file for complete search history.

(56) References Cited

U.S. PATENT DOCUMENTS

| | | | |
|---|---|---|---|
| 5,370,178 A * | 12/1994 | Agonafer | H01L 23/467 165/137 |
| 2008/0055852 A1* | 3/2008 | Uluc | H05K 7/20218 361/696 |
| 2008/0209234 A1* | 8/2008 | Clidaras | F03B 13/1885 713/300 |
| 2009/0295167 A1* | 12/2009 | Clidaras | F03B 13/20 290/55 |
| 2011/0299265 A1* | 12/2011 | Nakatsu | B60L 11/14 361/820 |
| 2013/0044426 A1* | 2/2013 | Neumann | G06F 1/20 361/679.54 |
| 2015/0007961 A1* | 1/2015 | Beery | H05K 7/2079 165/59 |
| 2015/0062806 A1* | 3/2015 | Shelnutt | H05K 7/203 361/679.53 |
| 2016/0174356 A1* | 6/2016 | Singh | H05K 1/0203 174/252 |

* cited by examiner

*Primary Examiner* — Courtney Smith
*Assistant Examiner* — Zhengfu Feng

(57) ABSTRACT

A computer system using 3D IC is cooled by using liquid coolants such as water, oil, and ionic liquid. Liquid coolant flows in a closed coolant conduit which is configured thermally to contact heat-generating components and a liquid-liquid heat exchanger. The heat generated in 3D IC chips is carried out by liquid coolant and dissipated to heat exchanger where cooling water dissipates heat to large water body. For economic stable operation, cooling water is pumped from large water body such as river to a water tower where water level is kept constant to ensure heat exchanger work at optimal condition. The simple approach for computer system cooling provided in this disclosure is a cost-effective data center efficiency solution.

12 Claims, 2 Drawing Sheets

COOLING METHOD FOR A 3D IC COMPUTER SYSTEM

FIELD

The embodiment of present invention is generally related to liquid cooling system for heat-generating components of computers. More specifically, the present invention relates liquid cooling system in computer systems having stacked three-dimensional (3D) integrated circuit (IC) used in data center.

BACKGROUND

Since it was invented in 1958, IC has been scaled to improve the performance. However, after the turn of the century, scaling resulted in short-channel effect and memory wall, which requires other approach to improve the IC performance more effectively.

3D IC offers a reasonable route to further improve IC performance. It improves IC performance by increasing device density, reducing the interconnect delay, and breaking memory wall with the application of 3D stacking using through silicon via (TSV). 3D IC also makes one chip package have more functional diversification than those enhanced only by shrinking the size of the features. The main advantages of 3D IC are the smaller form factor, low energy consumption, high speed, and functional diversification. It is predicted that 3D IC will be an enabler for improvement of data center performance and efficiency with positive consequences for global energy consumption and environment.

One of the biggest challenges in 3D IC stacking technology using TSV is thermal management owing to the high heat flux up to about 200 watts per square centimeter. Disclosure of this invention will provide a solution of 3D IC thermal management.

Data centers for internet and mobile devices are the most critical components in our information age. They serve industries, civil communications, military and defense applications, and transportations. Data centers consist of multiple computers usually called servers and switches. Both of them use many ICs. When a computer works, ICs will change status, or change the on-and-off status, which consumes electricity and generates significant heat. Even when computer system is at idle condition, it still consumes electricity due to the current leakage and circuit requirement.

Multiple servers are accommodated in a server rack at data center. Each computer consumes significant electricity. It is common for a server (computer) to consume over a hundred watts. In a server rack, i.e. a module of servers, there are multiple computers. Similarly, there are many server racks in a data center. Therefore, a data center consumes large amount of electricity and a large data center consumes the same amount of electricity as a small or medium size town. Among the contributions to the electricity consumption, most electricity is consumed by servers and their cooling systems. It is quite often that cooling system uses the same amount of electricity as the server computers. It is estimated that the date centers consume about two percent of total electricity generated worldwide.

Power usage effectiveness (PUE) is usually used to measure the efficiency of a data center. It is defined as a ratio of total energy used by facility to that used by information technology (IT) equipment. An ideal PUE is 1.0, but average PUE worldwide now is about 2.0 although some data center claims their PUE is significantly below 2.0. The average PUE value of 2.0 indicates the necessity to improve the data center cooling effectiveness. One approach to improve the cooling efficiency is to use water cooling to replace current air cooling. In the past, water cooling was used for large scale computers, but did not obtain large scale application for personal computers or servers in data center because of its limitation by the shape of heat-generating components and thus the complexity.

As the dimensions of integrated circuit components decrease, more components are compacted in a given area of a semiconductor integrated circuit (for example of 3D IC). Accordingly, more transistors are held on a given area and thus more heat is generated in the same area. In order to keep the IC temperature in allowed range for proper performance, heat generated has to be transferred out of integrated circuit effectively and economically. With the internet getting popular, more and more servers are installed and in service to support the internet function. The trend of applications of more mobile devices and cloudy technology will drive more electricity consumption at data centers in the future.

Current servers are located in an air-conditioner-regulated environment, usually in a specially designed building. The heat generated by microprocessors, memory chips, and power supply chips is released locally, which is like a large heater in a room cooled by air conditioner. Due to the low efficiency of air conditioner, the cooling system uses lots of electricity, occupies large footprints, and causes high costs.

Accordingly, it is very significant to provide an effective method to reduce cooling power and improve cooling efficiency for computer system, especially for the system with large number of computers such as data center. Cooling technology now becomes an enabler to improve data center efficiency.

Improving cooling system in data center not only saves energy consumption, but also benefits ecological and environmental systems. A few percent reduction of electricity consumption in data center cooling system will significantly decrease the emission of carbon dioxide amount, which equivalents to shut down multiple coal power plants with environmental benefit in addition to the cost reduction.

The heat generated in electronic devices in a data center has to be transferred outside the accommodating construction and dissipated to environment, which consumes tremendous electricity. In order to prevent the overheat of ICs, the surface of the ICs should be kept not very high, which means the temperature difference between high temperature source (IC surface) and low temperature environment will be significant low, resulting in the challenge in engineering realization and high costs in cooling system.

Traditionally, heat-generating components in computers are cooled by cold air supplied by air-conditioners. The air in server's building exchanges and dissipates heat on chiller's cold surface. By applying work, air conditioners transfer heat from a cold surface to a hot surface, and thus heat is dissipated to air outside the building by heat exchanging. This cooling method is accompanied with uses of lots of compressors and fans, and thus consumes significant electricity because of the low efficiency and high costs for air conditioning system.

In order to lower the cost of using air conditioner, cold air is used to directly cool the heat generating components in winter at north areas. However, the air humanity has to be controlled well and the application is also limited by weather and season.

Similarly, lots of power is used by fans in the server rack to dissipate heat from component surface to air by blowing air through the server rack, which also consumes significant energy, makes noise, and has low efficiency.

In order to overcome low efficient challenge in air cooling problems, water is used for cooling the heat-generating components. Current heat-generating components are mainly microprocessor unit (MPU), dynamic random-access memory (DRAM), and power chips. Microprocessor has a flat shape and it is relatively easy to use liquid cooling on a flat surface. However, it is difficult to use liquid cooling on DRAM dual in-line memory module (DIMM) due to the irregular shape although some attempts were tried.

In order to overcome the intrinsic problem mentioned above, liquid cooling was used by circulating liquid coolant on the surface of ICs to improve the efficiency. However, this method has to use chillers to cool the liquid, resulting in a low cooling efficiency.

In order to use natural water body for data center cooling, air cooling of server rack was combined with heat dissipation to large natural water bodies such as ocean, river, and lake. This approach may be the lowest data center operating cost and has the best potential for future application. However, there are lots of challenges for the realization of this method. Therefore, some novel method is disclosed in this invention for improving server cooling and data center efficiency.

SUMMARY

Methods for cooling a computer system using 3D ICs are provided herein. In some embodiments, a method of cooling multiple-computer systems includes: (a) circulating a first liquid coolant to dissipate heat from 3D IC heat-generating components such as microprocessors, memory chips, and power chips to the first liquid coolant; (b) heat-dissipating from the first coolant to a large water body such as river, reservoir, and ocean.

In one embodiment, there are a first coolant supply conduit and a first coolant return conduit on both sides of the IC package, the former supplies the first coolant to heat-generating components in servers, and the latter carries the heated first coolant out of heat-generating components in servers for heat exchange and thus dissipates heat to a second coolant in the heat exchanger so that the first coolant can be reused by circulation in a closed loop.

The most important thing for a reliable cooling performance is to keep the flow rate controllable in the cooling conduit on the heat-generating components. This is enabled by controlling the pressure in the supply conduit by using an in-line pump, large ratio of cross-sectional area of supply conduit to the sum of cooling conduit cross-sectional areas on the heat-generating components. The large cross-sectional area of supply conduit determines the constant pressure of first liquid coolant and then the controllable flow rates in cooling conduit on each heat-generating component, and then reliable cooling performance on every heat-generating component.

In one embodiment, liquid-liquid heat exchanger is used to dissipate heat finally to large water body. The water from large water body as a second liquid coolant needs to be pretreatment before used for cooling such as filtration to remove particles. After the pretreatment, the second coolant from the large water body will be pumped to a water tower where water surface level is maintained constant so that the water pressure on the outlet is kept constant, resulting in a constant delivery water pressure. After the second liquid coolant is used in heat exchanger, the only change is the little rise in temperature such as a few degrees. This discharge water is environmentally benign so that it can be returned to the large water body. For cooling performance controlling, valves are used on the conduit of the second liquid coolant so that the flow rate can be effectively controlled. For automatic control of the cooling performance, temperature sensors are disposed on the conduit of the second liquid coolant to feedback data for controlling the opening of the valves.

In winter season of north area, temperature is so low that water in the large water body may freeze. In order to avoid possible damage on conduits caused by freezing, the conduits of the second liquid coolant should have good protection such as underground arrangement. Such ideas are also applicable to other related parts like pumps.

Sucking of water by pump from the large water body is impacted by the water level elevation, especially when the large water body is a river. Special caution should be paid for adjustment of the relative conduit location and prevention of freeze in winter.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide apparatus and methods for removing heat from a 3D IC computer system. Particularly, embodiments of the present invention provide methods and apparatus for removing heat from the 3D IC package directly in the computer system. In one embodiment, a cooling liquid is disposed contacting to the heat-generating 3D IC components. The heat is carried out of the electronic device by cooling liquid and dissipated to a large water body such as river, reservoir, or ocean.

Figure 1:
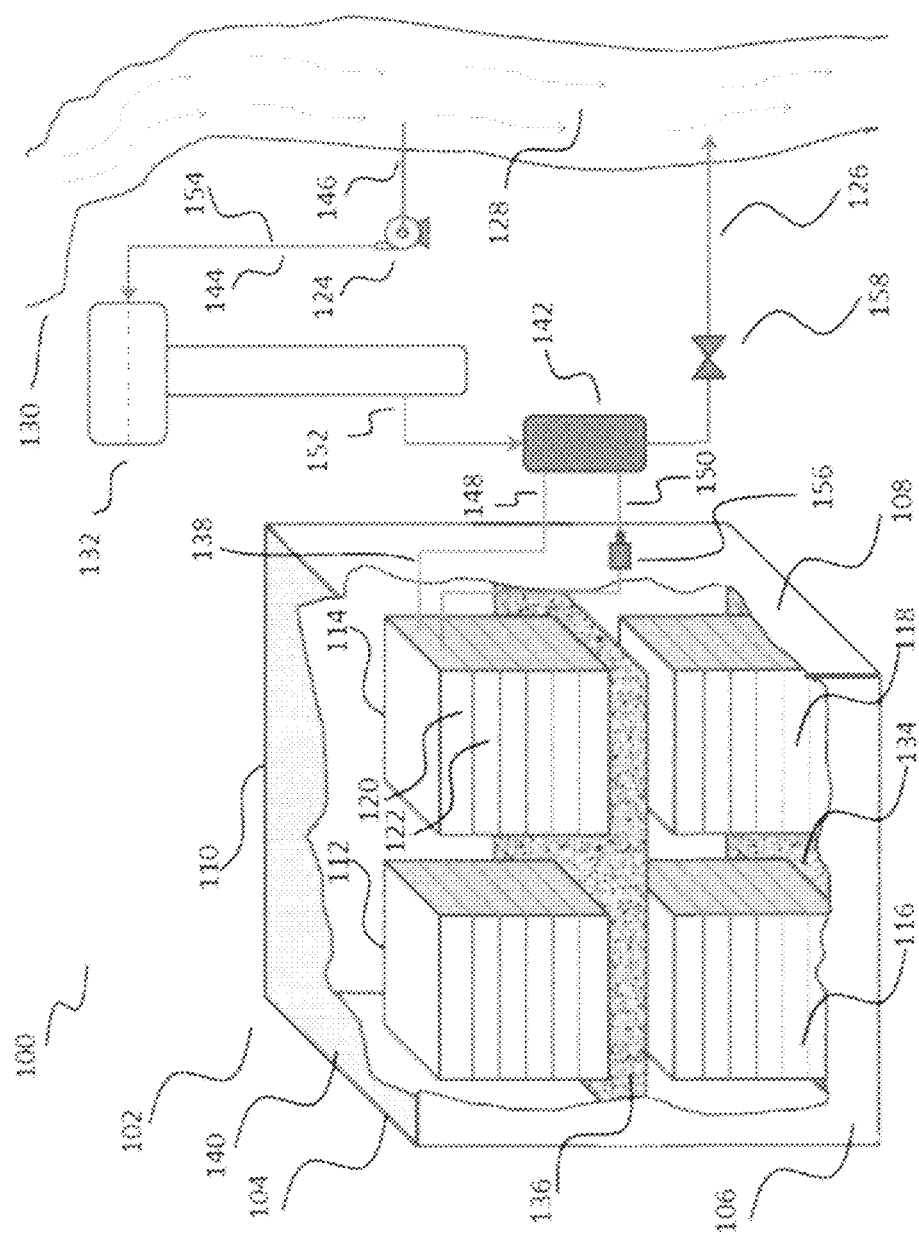
FIG. 1 depict one embodiment of computer cooling system having 3D ICs in accordance with one embodiment of the invention.

FIG. 1 schematically illustrates a cooling system 100 in accordance with one embodiment of the present invention. The cooling system 100 generally comprises a building 102 configured to accommodate computers. The cooling system 100 further comprises a river 130 in connection with the building 102 via a cooling water tower 132, liquid-liquid heat exchanger 142, cooling water conduit 152, drain conduit 126, pump outlet conduit 144, and pump inlet conduit 146.

The building 102 generally comprises a left sidewall 104, a front sidewall 106, a right sidewall 108, back sidewall 110, and roof 140. In one embodiment, the building 102 comprises first floor 134 and second floor 136.

The cooling system 100 comprises server rack 116 and server rack 118 on first floor 134. The cooling system 100 also includes server rack 112 and server rack 114 on second floor 136. A server rack usually accommodates multiple servers. In one embodiment, server rack 114 accommodates server 120 and server 122.

The cooling system 100 is configured to position a cooling liquid supply conduit 148 to flow cooling liquid 138 into server 120 and carry heat out of server 120 by flowing cooling liquid 138 out of server 120 in return conduit 150. The cooling liquid supply conduit 148 and return conduit 150 are connected to a liquid-liquid heat exchanger 142. The chip contact details will be further described below with references in FIG. 2. The heat exchanger 142 dissipates heat in the cooling liquid 138 to cooling water 154. In one embodiment, one end of the liquid-liquid heat exchanger 142 is configured to be connected with cooling water tower 132 for taking cooling water 154 and the other end is connected to river for draining cooling water 154.

During cooling process, the supply conduit 148 has a higher pressure compared with return conduit 150 to ensure the flow rate for cooling performance. The cooling liquid 138 in the supply conduit 148 has a lower temperature than the cooling liquid 138 in return conduit 150. The cooling liquid 138 in return conduit 150 transfers heat out of server 120 to cooling water 154 in liquid-liquid heat exchanger 142. During the cooling liquid 138 flowing through heat exchanger 142, temperature of cooling liquid 138 keeps falling, and attains such a low temperature when flowing out of the heat exchanger 142 that the temperature meets the requirement for flowing into heat-generating components in server 120.

The heat exchanger 142 can be configured for cooling of one server, or one server rack, or multiple server racks. When heat exchanger 142 is used for cooling of multiple servers, the constant pressures in supply conduit 148 and return conduit 150 should be kept well. The cooling liquid 138 should be stable and bubbles are not allowed in order to ensure the quality of cooling and heat exchanging.

The liquid-liquid heat exchanger 142 may have high heat exchange efficiency due to the high density of liquid. The temperature difference between supply conduit 148 and return conduit 150 is low to avoid high temperature variation in heat-generating components in computer system. Typical temperature difference between these two conduits is 10-30° C. The circulation of cooling liquid 138 is driven by a pump 156 in order to have acceptable heat exchanging rate on the surface of heat-exchanging components.

During cooling processing of one embodiment, cooling water 154 is sucked from the river 130. For data center located in north cold area, the pump inlet conduit 146 should be well protected from freezing because it may damage the pipe system. In one embodiment, the pump inlet conduit 146 is laid underground to avoid freezing in winter. Similarly, pump 124, tower 132, conduits 144, 152, and 126 should be protected well during winter for data center located in north area.

According to one embodiment of the invention, the elevation of cooling water 154 in cooling tower 132 should be automatically controlled the same all the time. This can be controlled by a continuous operation mode of cooling water pump 124, or non-continuous operation mode, depending on the design. After data center facility is in operation, the cooling water flow rate is mainly determined by water level of the cooling water 154 in cooling water tower 132. In one embodiment, a regulating valve 158 is used to adjust the flow rate of cooling water 154 in the liquid-liquid heat exchanger 142 by varying the opening.

In one embodiment, a grate and filter is used at one end of cooling water inlet conduit 146 to keep the contaminants out of the cooling system. In addition, the elevation of one end of cooling water conduit 146 for sucking water in the river 130 should be adjusted according to the level of river, especially in the north area where river water level changes with season significantly.

For convenience of operation, the building 102 should be located close to the river 130 to reduce the length of the conduits. To ensure the performance of cooling system 100, the river current 128 should be high enough for cooling of a data center. Generally, the river stream 128 should have a discharge of 40 $m^3/s$ or higher for cooling of a large data center.

In one embodiment, the cooling liquid 138 is deionized water. In another embodiment, the cooling liquid 138 is oil or ionic liquid.

Figure 2:
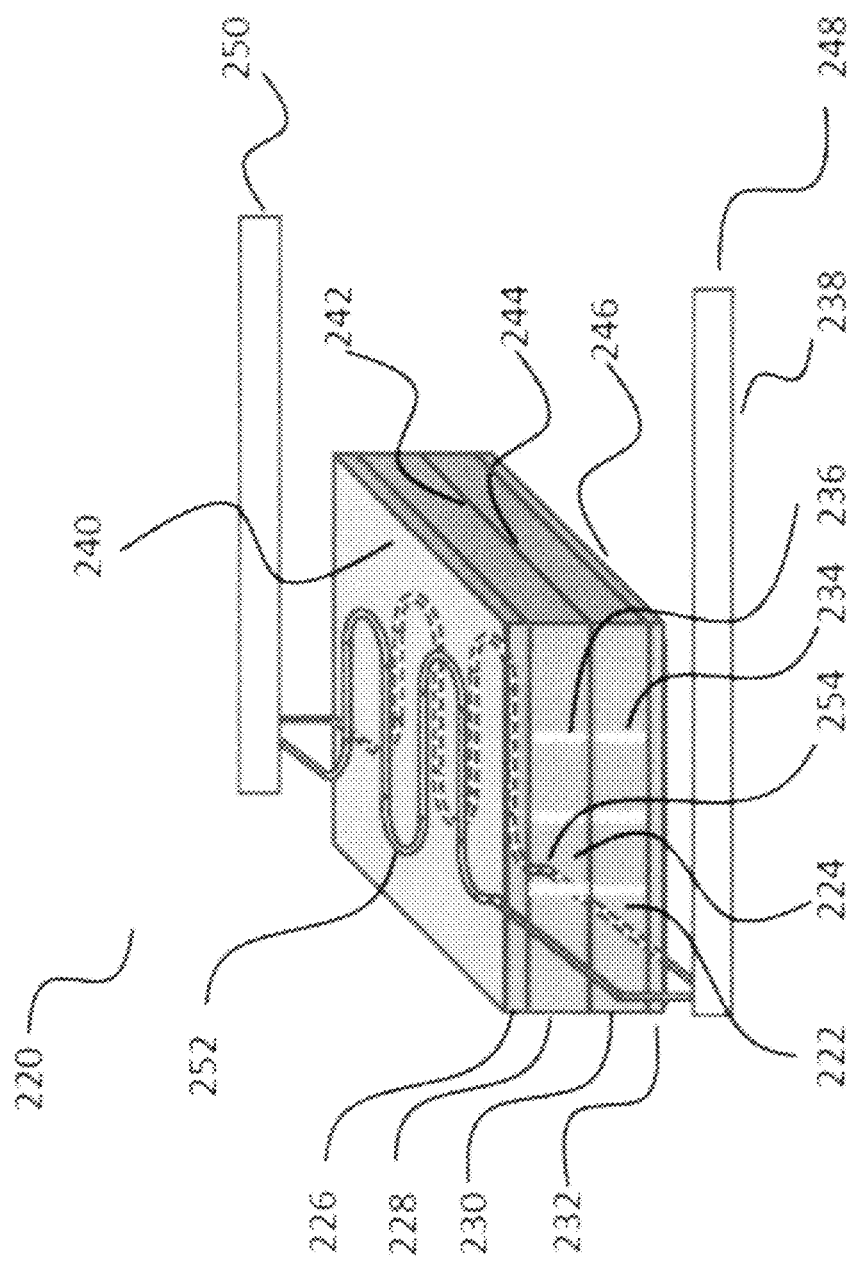
FIG. 2 depicts a schematic view of a 3D IC cooling method that may be utilized to cool the computer in accordance with one embodiment of the present invention.

FIG. 2 schematically illustrates an enlarged view of the server 220 disposed in the server rack 114 of FIG. 1. The server 220 includes a microprocessor 222, a memory 224, a microprocessor liquid conduit 254 configured to flow a first liquid coolant 238 thermally contacting with the microprocessor 222, a memory liquid conduit 252 configured to flow the first liquid coolant 238 thermally contacting the memory 224.

The microprocessor 222 has a front side 246, a back side 244, a device layer 232, a silicon layer 230, and a plural of through silicon via (TSV) 234. Electricity is mostly consumed at device layer, so that this layer becomes the main heat-generating component. In one embodiment, the first liquid coolant 238 flows in the microprocessor conduit 254 for carry out heat from the microprocessor 222.

In one embodiment, the memory 224 has a memory front side 240, a memory back side 242, a memory device layer 226, a memory silicon layer 228, and a plural of memory TSV 236. The memory back side 242 is bonded with the microprocessor back side 244 for mechanical and electric interconnection between the microprocessor 222 and the memory 224.

The cross-sectional areas of liquid conduits impact cooling effectiveness. In one embodiment, the cross-sectional areas of the supply conduit 248 and the return conduit 250 are significantly larger than those of the MPU liquid conduit 254 and the memory liquid conduit 252.

During cooling processing, the cooling liquid 238 is circulated in a closed loop shown in FIG. 1. Liquid conduits shown in FIG. 2 are part of the total closed loop. In order to have effective heat exchanges between heat-generating components and the cooling liquid 238, moderate flow rate in heat-generating components should be kept. Generally, the turbulent flow in MPU liquid conduit 254 and the memory liquid conduit 252 should be maintained. The pump 156 shown in FIG. 1 drives the flow rate and ensures the effectiveness of heat dissipation.

Heat dissipation makes temperature in the return conduit 250 higher than that in the supply conduit 248. The higher temperature difference between these two conduits means more energy carried out at a same flow rate. However, low temperature difference should be kept in order to have a more uniform temperature on the heat-generating components. The non-uniformity of temperature may introduce extra stress, resulting in reliability issues. Typical temperature difference between the supply conduit 248 and return conduit 250 is about 20° C.

MPUs consume most power in a computer system. Effective contact between the MPU liquid conduit 254 and the MPU 222 is the key to cool the MPU. The plane ship of the MPU 222 generally makes the realization of thermal contact easy. However, common memory is packaged in single in-line memory module (SIMM) or dual in-line memory module (DIMM), which has a non-plane shape, resulting in challenges in thermal contact effectiveness.

Recently, 3D IC stacked by using TSV provides effective way to make DRAM package have a plane geometry. In one embodiment of this disclosure, stacked DRAM as the memory 224 is used for the server 220. Therefore, the memory 224 has a plane for obtaining effective thermal contact with the cooling liquid 238.

In one embodiment, heat-generating components are modules, but there are some passive components which release small amount of heat. For dissipating this heat, a cooling conduit may be thermally contacted with the motherboard or interposer to dissipate heat.

While the foregoing is directed to embodiments of the present invention, other and further embodiments of the invention may be devised without departing from the basic scope thereof, and the scope thereof is determined by the claims that follow.

What is claimed is:

1. A cooling system for a plurality of integrated circuits in a computer system, comprising:
   a. A first integrated circuit having a first bonding side and a first non-bonding side;
   b. A second integrated circuit having a second bonding side and a second non-bonding side, wherein said first bonding side of said first integrated circuit is bonded with said second bonding side of said second integrated circuit using through silicon via interconnect for mechanical bonding and electric interconnection between said first integrated circuit and said second integrated circuit;
   c. One or a plurality of first heat-exchanging channels configured to be placed in thermal contact with said first non-bonding side of said first integrated circuit;
   d. One or a plurality of second heat-exchanging channels configured to be placed in thermal contact with said second non-bonding side of said second integrated circuit;
   e. A liquid-liquid heat exchanger including a first exchanger conduit and a second exchanger conduit wherein a first liquid coolant flows in said first exchanger conduit and a cooling water flows in said second exchanger conduit; heat is dissipated from said first liquid coolant in said first exchanger conduit to said cooling water in said second exchanger conduit;
   f. A closed conduit including a supply conduit, said first heat-exchanging channels, said second heat-exchanging channels, a return conduit, and said first exchanger conduit of said liquid-liquid heat-exchanger; wherein said first liquid coolant is configured to be circulated in said closed conduit; said supply conduit is configured to flow said first liquid coolant into said first heat-exchanging channels; said supply conduit is configured to flow said first liquid coolant into said second heat-exchanging channels; the return conduit is configured to receive said first liquid coolant from said first heat-exchanging channels and said second heat-exchanging channels; said supply conduit and said return conduit have larger cross-sectional areas for flowing of said first liquid coolant than sum of cross-sectional areas of said first heat-exchanging channels and second heat exchanging channels;
   g. A first pump configured to drive circulation of said first liquid coolant in said closed conduit;
   h. A water tower configured to have an elevated water level higher than the elevation of a large water body; wherein a second pump is configured to pump said cooling water from said large water body into said water tower; a drain outlet is configured at a lower elevation than said elevated water level to allow said cooling water to flow out of said water tower;
   i. A cooling conduit configured to connect said drain outlet to a first end of a second conduit of said liquid-liquid heat exchanger to flow said cooling water from said water tower into said liquid-liquid heat exchanger;
   j. A back conduit configured to connect a second end of said second conduit of said liquid-liquid heat exchanger to said large water body to allow said cooling water to flow from said liquid-liquid heat exchanger to said large water body.

2. The cooling system of claim 1, wherein said first integrated circuit is a microprocessor unit.

3. The cooling system of claim 1, wherein said second integrated circuit is a dynamic random access memory.

4. The cooling system of claim 1, wherein said second integrated circuit is a non-volatile memory chip.

5. The cooling system of claim 1, wherein said large water body is a river.

6. The cooling system of claim 1, wherein said large water body is a reservoir.

7. The cooling system of claim 1, wherein said large water body is an ocean.

8. The cooling system of claim 1, wherein said first liquid coolant is water.

9. The cooling system of claim 1, wherein said first liquid coolant is oil.

10. The cooling system of claim 1, wherein said first liquid coolant is ionic liquid.

11. The cooling system of claim 1, wherein said computer system is a server.

12. The cooling system of claim 1, wherein said elevated water level is at least two meters higher than the elevation of said large water body.

* * * * *